US010573764B2

(12) United States Patent
De Ceuster et al.

(10) Patent No.: US 10,573,764 B2
(45) Date of Patent: *Feb. 25, 2020

(54) SOLAR CELL WITH REDUCED BASE DIFFUSION AREA

(71) Applicant: SUNPOWER CORPORATION, San Jose, CA (US)

(72) Inventors: Denis De Ceuster, Woodside, CA (US); Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 1391 days.

This patent is subject to a terminal disclaimer.

(21) Appl. No.: 14/159,292

(22) Filed: Jan. 20, 2014

(65) Prior Publication Data
US 2014/0190561 A1    Jul. 10, 2014

Related U.S. Application Data

(63) Continuation of application No. 13/185,718, filed on Jul. 19, 2011, now Pat. No. 8,664,519, which is a
(Continued)

(51) Int. Cl.
*H01L 31/00*    (2006.01)
*H01L 31/0224*    (2006.01)
(Continued)

(52) U.S. Cl.
CPC ............... *H01L 31/022425* (2013.01); *H01L 31/022441* (2013.01); *H01L 31/061* (2013.01);
(Continued)

(58) Field of Classification Search
CPC ..... H01L 31/022425; H01L 31/022441; H01L 31/061; H01L 31/0682; H01L 31/18; Y02E 10/547
(Continued)

(56) References Cited

U.S. PATENT DOCUMENTS

| 2002/0046765 A1 | 4/2002 | Uematsu et al. |
| 2005/0016585 A1 | 1/2005 | Munzer |
| 2006/0130891 A1 | 6/2006 | Carlson |

FOREIGN PATENT DOCUMENTS

| EP | 2 218 107 B1 | 10/2016 |
| WO | WO 2009/074466 A1 | 6/2009 |

OTHER PUBLICATIONS

William P. Mulligan, et al. "Manufacture of Solar Cells with 21% Efficiency", Jun. 7, 2004, 4 sheets, XP055132121.
(Continued)

*Primary Examiner* — Thanh Truc Trinh
(74) *Attorney, Agent, or Firm* — Okamoto & Benedicto LLP

(57) ABSTRACT

In one embodiment, a solar cell has base and emitter diffusion regions formed on the back side. The emitter diffusion region is configured to collect minority charge carriers in the solar cell, while the base diffusion region is configured to collect majority charge carriers. The emitter diffusion region may be a continuous region separating the base diffusion regions. Each of the base diffusion regions may have a reduced area to decrease minority charge carrier recombination losses without substantially increasing series resistance losses due to lateral flow of majority charge carriers. Each of the base diffusion regions may have a dot shape, for example.

13 Claims, 9 Drawing Sheets

Related U.S. Application Data continuation of application No. 11/492,282, filed on Jul. 24, 2006, now Pat. No. 8,008,575.

(51) Int. Cl.
*H01L 31/061* (2012.01)
*H01L 31/068* (2012.01)
*H01L 31/18* (2006.01)

(52) U.S. Cl.
CPC .......... *H01L 31/0682* (2013.01); *H01L 31/18* (2013.01); *Y02E 10/547* (2013.01)

(58) Field of Classification Search
USPC .................................................. 136/243–293
See application file for complete search history.

(56) References Cited

OTHER PUBLICATIONS

Extended European Search Report for Application No. EP 07 809 355.6, dated Aug. 8, 2014, 7 sheets.

SOLAR CELL WITH REDUCED BASE DIFFUSION AREA

CROSS-REFERENCE TO RELATED APPLICATIONS

This application is a continuation of U.S. application Ser. No. 13/185,718, filed on Jul. 19, 2011, now U.S. Pat. No. 8,664,519, which is a continuation of U.S. application Ser. No. 11/492,282, filed on Jul. 24, 2006, now U.S. Pat. No. 8,008,575. The just-mentioned disclosures are incorporated herein by reference in their entirety.

BACKGROUND OF THE INVENTION

1. Field of the Invention

The present invention relates generally to solar cells, and more particularly but not exclusively to solar cell structures.

2. Description of the Background Art

Solar cells are well known devices for converting solar radiation to electrical energy. They may be fabricated on a semiconductor wafer using semiconductor processing technology. Generally speaking, a solar cell may be fabricated by forming P-type and N-type diffusion regions in a silicon substrate. Solar radiation impinging on the solar cell creates electrons and holes that migrate to the diffusion regions, thereby creating voltage differentials between the diffusion regions. In a back side contact solar cell, both the diffusion regions and the metal grids coupled to them are on the back side of the solar cell. The metal grids allow an external electrical circuit to be coupled to and be powered by the solar cell. Back side contact solar cells are also disclosed in U.S. Pat. Nos. 5,053,083 and 4,927,770, which are both incorporated herein by reference in their entirety.

Efficiency is an important characteristic of a solar cell as it is directly related to the solar cell's capability to generate power. Accordingly, techniques for increasing the efficiency of solar cells are generally desirable. The present invention discloses improved back side contact cell structures that allow for higher efficiency compared to conventional solar cells.

SUMMARY

In one embodiment, a solar cell has base and emitter diffusion regions formed on the back side. The emitter diffusion region is configured to collect minority charge carriers in the solar cell, while the base diffusion region is configured to collect majority charge carriers. The emitter diffusion region may be a continuous region separating the base diffusion regions. Each of the base diffusion regions may have a reduced area to decrease minority charge carrier recombination losses without substantially increasing series resistance losses due to lateral flow of majority charge carriers. Each of the base diffusion regions may have a dot shape, for example.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of structures and fabrication steps, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present disclosure relates to the fabrication of solar cells. Solar cell fabrication processes are also disclosed in the following commonly-assigned disclosures, which are incorporated herein by reference in their entirety: U.S. application Ser. No. 10/412,638, entitled "Improved Solar Cell and Method of Manufacture," filed on Apr. 10, 2003 by William P. Mulligan, Michael J. Cudzinovic, Thomas Pass, David Smith, Neil Kaminar, Keith McIntosh, and Richard M. Swanson; U.S. Publication No. 2004/0200520 (application Ser. No. 10/412,711), entitled "Metal Contact Structure For Solar Cell And Method Of Manufacture," filed on Apr. 10, 2003 by William P. Mulligan, Michael J. Cudzinovic, Thomas Pass, David Smith, and Richard M. Swanson; and U.S. Pat. No. 6,998,288 issued to Smith et al.

In normal operation, minority charge carriers are collected in the emitter diffusion regions of the solar cell and majority charge carriers are collected in the base diffusion regions. In the case of a back side contact solar cell with an N-type substrate, the minority charge carriers are collected by the P-type diffusion region (the "emitter diffusion region" in this case), and in turn are conducted through a metal grid to the positive terminal. The majority charge carriers are collected by the N-type diffusion (the "base diffusion region" in this case), and in turn are conducted by a metal grid to the negative terminal. Given that carrier generation mostly occurs on the front side of the solar cell, both majority and minority charge carriers must travel from the point of generation to the back surface to be collected by the diffusion regions. This distance, also referred to as "carrier path length", is a key parameter in determining the performance of a back side contact solar cell.

Figure 1:
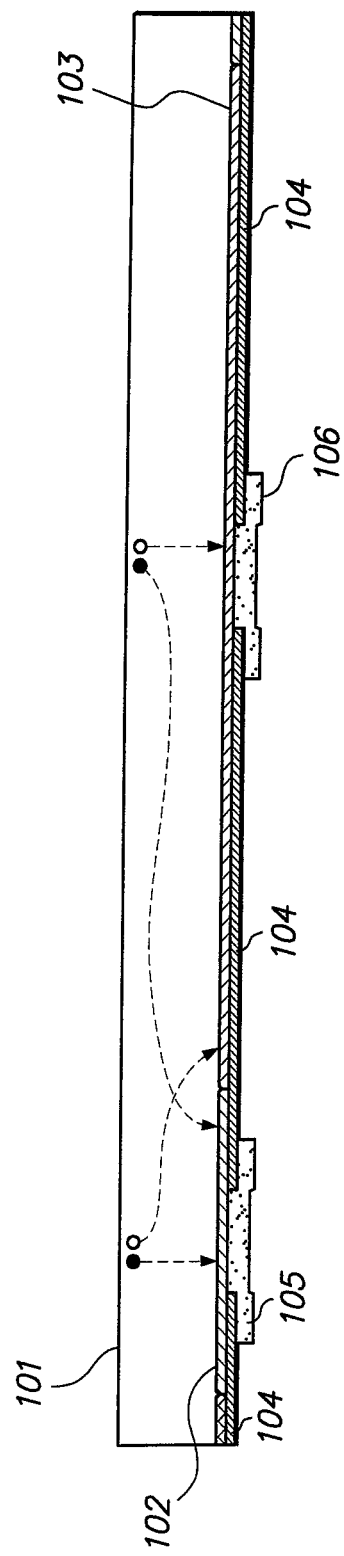
FIG. 1 shows a cross-section of a back side contact solar cell, schematically illustrating lateral transport of charge carriers.

The majority and minority charge carrier path lengths are dependant on the pitch (i.e. spacing) of the diffusion regions on the back side of the solar cell. The larger the pitch, the further the charge carriers must travel laterally from the point of generation to be collected. FIG. 1 shows a cross-section of an example back side contact solar cell, schematically illustrating lateral transport of charge carriers. In the example of FIG. 1, the solar cell comprises a wafer 101 having a base diffusion region 102 and an emitter diffusion region 103 on the back side thereof. A base metal finger 105 allows for external electrical connection to the base diffusion region 102, while an emitter metal finger 106 allows for external electrical connection to the emitter diffusion region. An insulation layer 104 is formed over the diffusion regions. In the example of FIG. 1, the wafer 101 is an N-type silicon wafer having a thickness of about 0.200 mm, and the pitch of the diffusion regions is about 2.000 mm. The filled circles represent electrons, which are the majority charge carriers in this example. The empty circles represent holes, which are the minority charge carriers in this example. The dash lines represent charge carrier travel paths in the wafer 101.

The lateral transport of minority and majority charge carriers introduces two undesirable loss mechanisms to back side contact solar cells: (a) increased minority charge carrier recombination from lateral minority charge carrier transport and (b) increased series resistance from lateral majority charge carrier transport. Because the pitch is several times larger than thickness of the wafer in the example of FIG. 1, the lateral transport of the charge carriers, and thus the losses associated with it, becomes significant.

Figure 2:
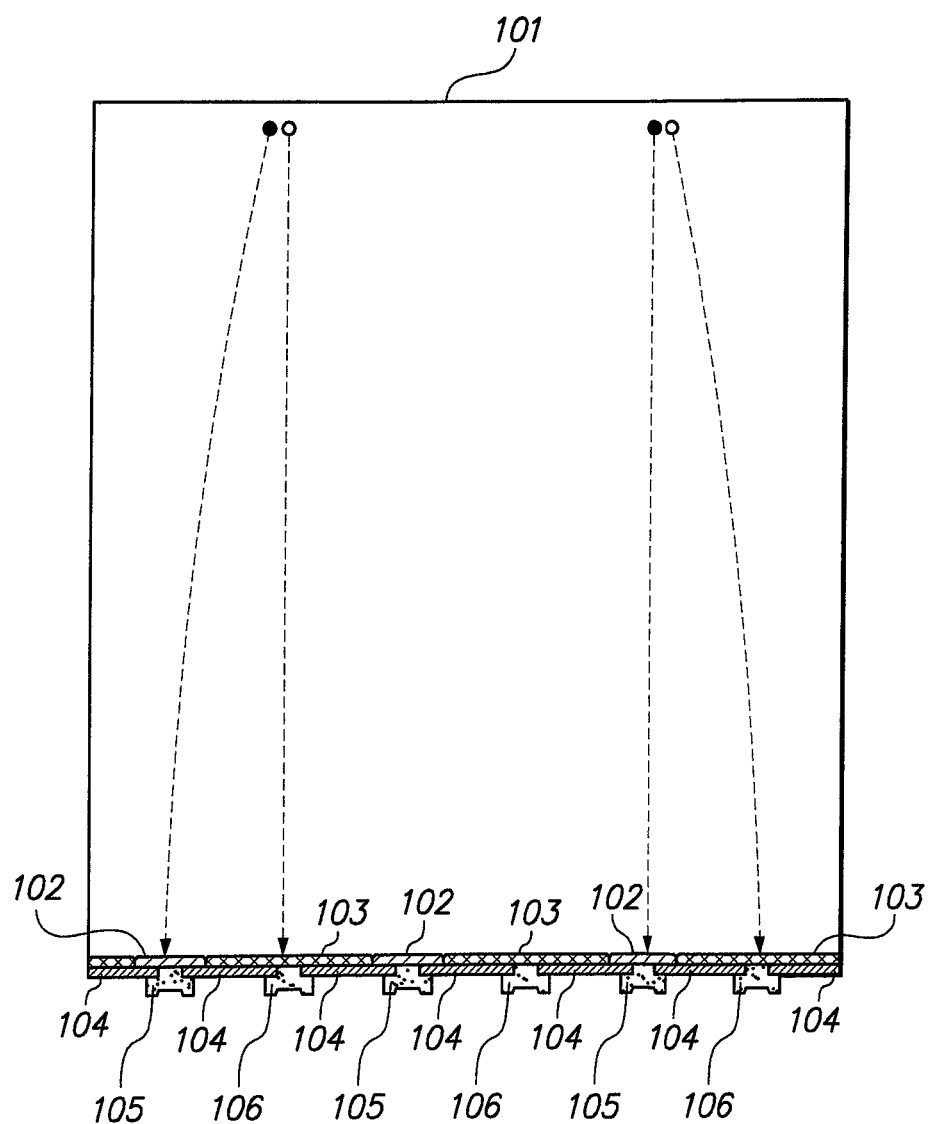
FIG. 2 schematically illustrates vertical transport of charge carriers in the solar cell of FIG. 1 if the pitch of the diffusion regions was made smaller than the thickness of the wafer.

If the pitch is several times smaller than the thickness of the wafer, the charge carrier transport is mostly one-dimensional (vertical transport) and the aforementioned lateral loss mechanisms are minimized. This is schematically illustrated in FIG. 2, which shows vertical transport of charge carriers in the solar cell of FIG. 1 if the pitch of the diffusion regions was made smaller than the thickness of the wafer 101. The solar cells of FIGS. 1 and 2 are the same except for the thickness of the wafer 101 and the pitch of the diffusion regions. In the example of FIG. 2, the wafer 101 is 0.150 mm thick and the pitch of the diffusion regions is about 0.050 mm. The filled circles represent electrons, which are the majority charge carriers in this example. The empty circles represent holes, which are the minority charge carriers in this example. The dash lines represent the charge carrier travel paths in the wafer 101. The other components of FIG. 2 have been previously discussed with reference to FIG. 1.

Two types of high efficiency back side diffusion solar cell designs have been used to minimize losses within the solar cell. The first is the point diffusions typically used for concentrator systems (e.g., see "An Optimization Study of Point-Contact Concentrator Solar Cells", R. A. Sinton and R. M. Swanson, IEEE Photovoltaic Specialist Conference, 1987, pp 1201-1208). The second is the striped diffusions typically used for one-sun (non-concentrating) applications (e.g., see "7000 High-efficiency Cells for a Dream", P. J. Verlinden, R. M. Swanson and R. A. Crane, Progress in PhotoVoltaics, Vol 2, 1994, p 143-152).

Figure 3A:
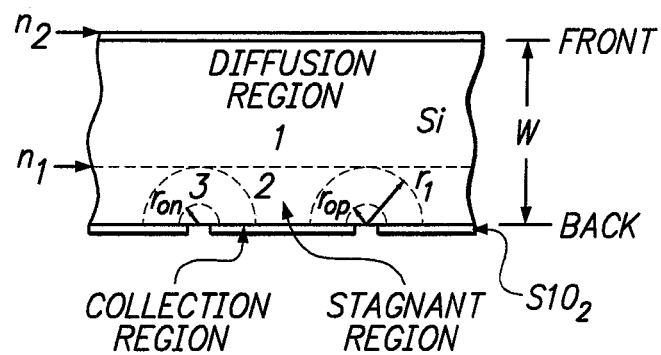
FIGS. 3(a) and 3(b) show a cross-section view and a perspective view, respectively, of an example solar cell employed in concentrator systems.
Figure 3B:
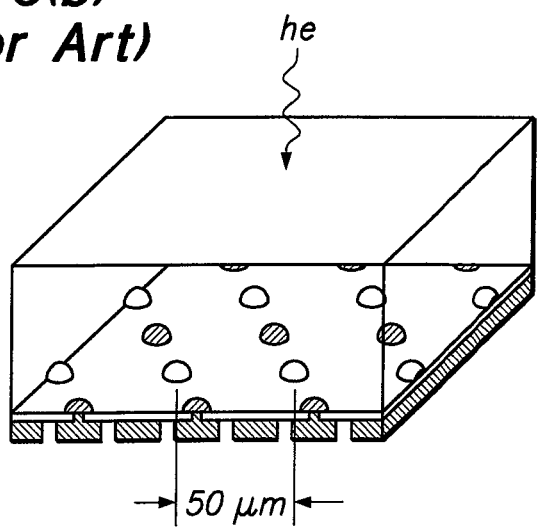

A concentrator system uses optics to capture solar energy shining on a large area and then focuses that energy onto a smaller area where the solar cell is located. FIGS. 3(a) and 3(b), which are from the cited publication by R. A. Sinton and R. M. Swanson, show a cross-section view and a perspective view, respectively, of an example solar cell employed in concentrator systems. The typical wafer thickness in such point diffusion solar cells is about 150 microns. The point diffusion back junction design is used in concentrator systems to minimize Auger recombination associated with the diffusion, whilst maintaining short majority and minority charge carrier path lengths. Solar cells under concentrated light operate at high injection levels, where the dominating carrier recombination mechanism is Auger recombination within the diffusions. To optimize performance, it is preferable to use a point diffusion design where the size of both the N-type and P-type diffusion regions, hence Auger recombination, is minimized. The small size of both base and emitter diffusion regions (e.g., about 10 microns) reduces recombination losses. However, it is also important to keep the distance between diffusion regions small to reduce both the majority and minority charge carrier path lengths. It should also be noted that diffusion regions on the order of 10 microns, like those for point diffusion designs, involve relatively low throughput, expensive equipment not compatible with the fabrication of low-cost solar cells.

Strip diffusion solar cells are used in non-concentrating applications, also referred to as "one-sun" or "flat-plate" systems. The strip diffusion back junction design is used in non-concentrating applications to minimize surface recombination, whilst maintaining short majority and minority charge carrier path lengths. The dominant recombination mechanism in one-sun back junction solar cells is the silicon interface, i.e.

surface recombination. In a strip design, the entire back side surface of the solar cell has either N-type diffusion region or P-type diffusion region as this minimizes recombination. The minority and majority charge carrier path lengths are minimized by keeping the pitch of the metal fingers as small as the alignment tolerances allow.

Figure 4:
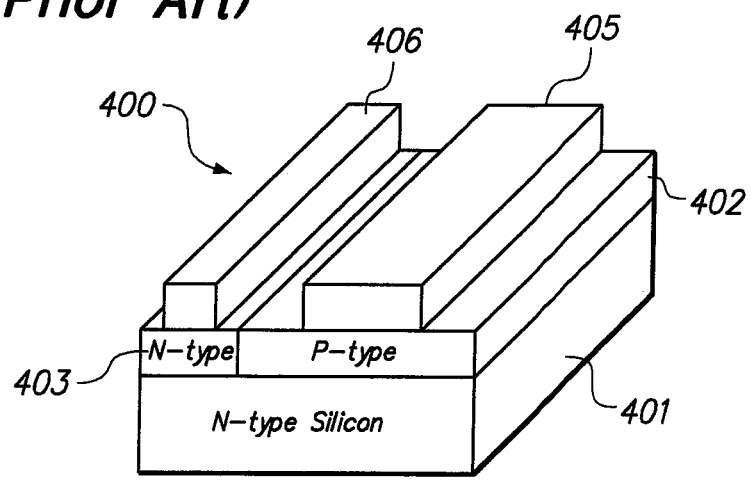
FIG. 4 schematically shows an example solar cell with strip diffusion regions.

FIG. 4 schematically shows an example solar cell 400 with strip diffusions. In the solar cell 400, an N-type diffusion region 403 and a P-type diffusion region 402 are strip, rectangular diffusion regions formed on the back side of the solar cell 400 on an N-type silicon wafer 401. A metal grid 406 contacts the N-type diffusion region 403 (base diffusion region in this example) and a metal grid 405 contacts the P-type diffusion region 402 (emitter diffusion region in this example) also on the back side of the solar cell 400.

Strip diffusion back junction solar cells for commercial one-sun applications have been fabricated using relatively low cost patterning techniques, such as screen-printing (e.g., see "The Choice of silicon wafer for the production of low-cost rear-contact solar cells", K. McIntosh, M. Cudzinovic, D. Smith, W. Mulligan and R. Swanson, Proceedings of WCPEC-3, Osaka, Japan, May 11-18, 2003). Although more cost effective, these printing techniques have a much lower resolution and alignment precision than photolithography, resulting in a pitch that is significantly larger than the wafer thickness.

The performance of these cells is limited by both minority charge carrier and majority charge carrier lateral transport losses.

With these low cost patterning techniques, the design of the strip pattern requires a compromise between the lateral transport losses of the minority charge carriers and the lateral transport losses of the majority charge carriers. The cell designer must choose a finger pitch to balance (a) the minority charge carrier recombination resulting from lateral transport of the minority charge carriers and (b) the series resistance losses resulting from lateral transport of the majority charge carriers. Typically, the result is that the emitter diffusion strips (e.g., P-type diffusion region 402) are made larger than the base diffusion strips (e.g., N-type diffusion region 403) to allow for one-dimensional vertical flow of minority charge carriers over most of the cell. If the designer was to increase the pitch, the minority charge carrier diffusion losses would decrease as the minority charge carrier transport is mostly vertical, but this would also increase the lateral path of majority charge carriers, resulting in increased resistive losses. If the designer was to reduce the pitch, the resistive losses would decrease, but the effective path for the minority charge carriers would increase, increasing minority charge carrier recombination losses.

Embodiments of the present invention reduce the adverse impact of two-dimensional effects by utilizing a back side junction solar cell structure with reduced base diffusion region areas. In the following examples, the base diffusion regions are "dotted" in that each has a dot shape (e.g., circle, elliptical). It is to be noted that the dots may also be replaced with rectangular shapes. The dotted diffusion regions may also have other shapes without detracting from the merits of the present invention.

Figure 5:
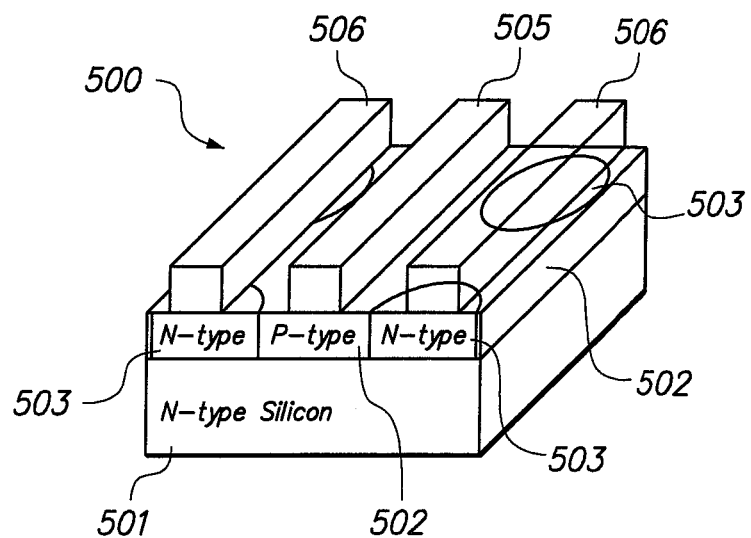
FIG. 5 schematically shows a solar cell in accordance with an embodiment of the present invention.

FIG. 5 schematically shows a solar cell 500 in accordance with an embodiment of the present invention. The solar cell 500 is configured to be used in one sun (i.e., non-concentrator) applications. The solar cell 500 includes base diffusion regions with reduced areas in the form of dotted base diffusion regions 503. In the example of FIG. 5, the base diffusion regions 503 comprise N-type diffusion regions, while a continuous emitter diffusion region 502 comprises a P-type diffusion region; both diffusion regions are formed in an N-type silicon wafer 501. A metal grid 506 is electrically coupled to the base diffusion regions 503 (e.g., to two or more base diffusion regions 503) and a metal grid 505 is electrically coupled to the continuous emitter diffusion region 502. One of the metal grids 506 in FIG. 5 has been drawn as transparent to show the non-rectangular shape (dot in this example) of the base diffusion regions 503. The metal grids 505 and 506 may be interdigitated. An external electrical circuit may be coupled to the metal grids 505 and 506 to receive electrical current from the solar cell 500. The solar cell 500 is a back side contact solar cell in that the diffusion regions 502 and 503, as well as the metal grids 506 and 505, are formed on the back side of the solar cell 500. The surface of the wafer 501 opposite the diffusion regions 503 and 502 is the front side of the solar cell 500, and faces the sun during normal operation.

As shown in FIG. 5, the dotted base diffusion design has a blanket rear emitter diffusion region 502 covering most of the back side surface of the solar cell 500, with periodic dots of base diffusion regions 503. That is, instead of alternating strips of base and emitter diffusion regions as in the strip design, the dotted base diffusion design has a continuous emitter diffusion region, with a plurality of base diffusion regions being formed in regions in the back side of the solar cell not occupied by the emitter diffusion region. The continuous emitter diffusion region 502 surrounds two or more separate diffusion regions 503. The interdigitated metal grids 506 and 505 connect the diffusion regions to their respective terminals, i.e. positive for the P-type diffusion region 502 and negative for the N-Type diffusion regions 503. One advantage of this design is that the transport of minority charge carriers is mostly vertical (i.e. one-dimensional), minimizing recombination losses. Given that the minority charge carrier losses have been substantially reduced, the design trade-off between minority and majority charge carrier lateral transport is shifted significantly towards smaller pitches and equal finger sizes. This results in the design also reducing the series resistance associated with lateral transport of the majority charge carriers. It should also be noted that the reduction of minority charge carrier losses will be even more substantial when using low life-time silicon as the substrate. This opens the possibility of fabricating high efficiency back junction solar cells using cheaper, lower quality silicon (as, for example, multi-crystalline or low grade CZ silicon).

In the example of FIG. 5, because the base diffusion regions 503 are interspersed and surrounded by the continuous emitter diffusion region 502, the metal grids 506 of the base diffusion regions 503 run over the emitter diffusion regions. Care thus needs to be taken to ensure that the metal grids 506 are electrically insulated from the underlying emitter diffusion 502 to prevent the introduction of a shunt loss. This may be accomplished with a defect free insulator layer between the negative grid and the emitter diffusion. Openings formed in this insulator allow contact between the base diffusion regions 503 and the metal grid 506.

Figure 6A:
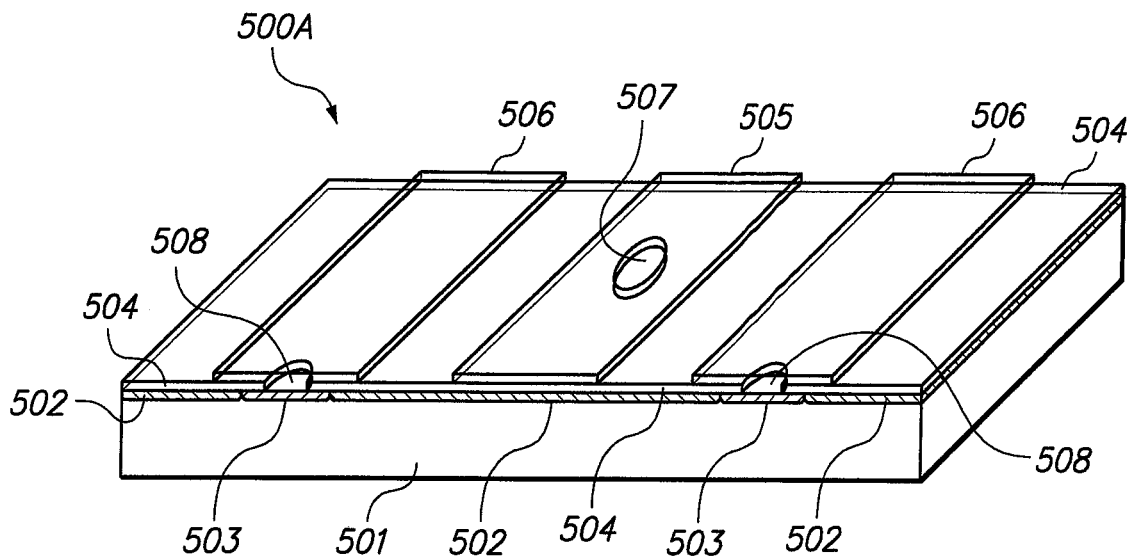
FIGS. 6(a), 6(b), 7(a), 7(b), 8(a), and 8(b) schematically show variations of the solar cell of FIG. 5, in accordance with embodiments of the present invention.
Figure 6B:
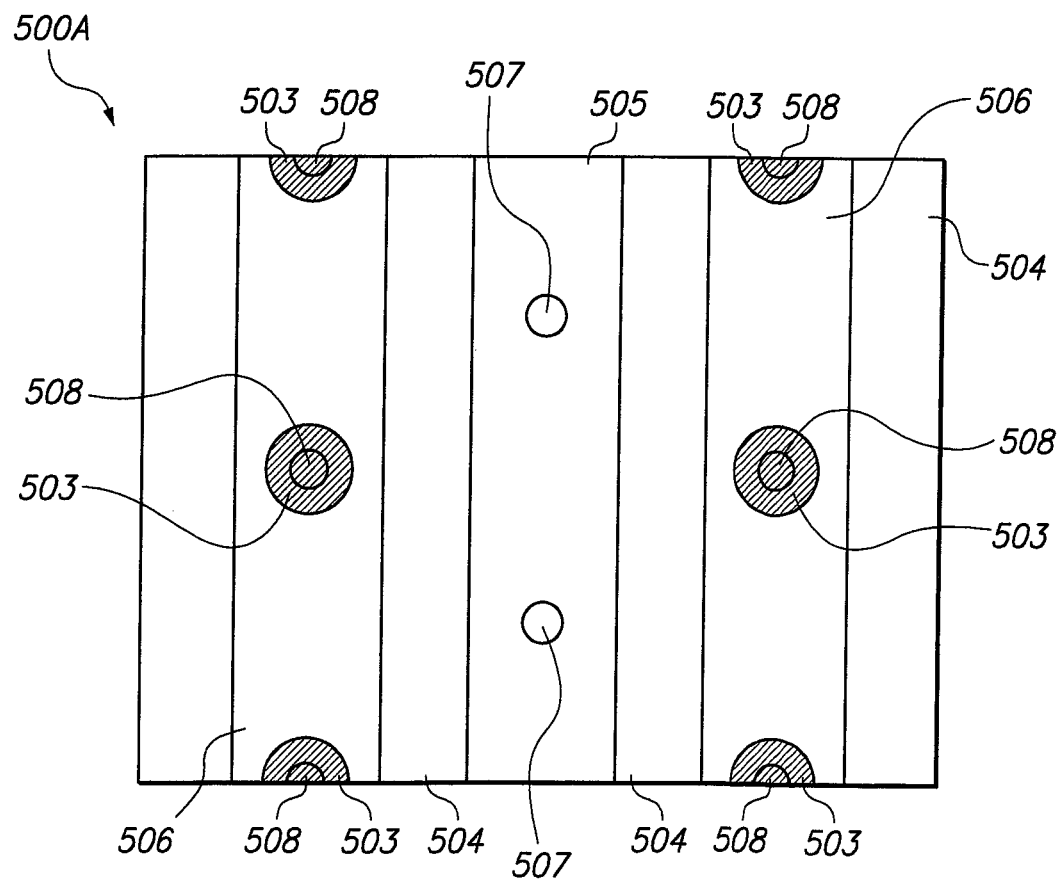

FIGS. 6(a) and 6(b) schematically show a perspective view and a top view, respectively, of a solar cell 500A in accordance with an embodiment of the present invention. Solar cell 500A is a specific embodiment of the solar cell 500 shown in FIG. 5. Components 501, 502, 503, 505, and 506 are thus the same as previously described with reference to FIG. 5. In the example of FIG. 6(a), an insulator layer 504 is formed between the metal grids and the diffusion regions to prevent electrical shunts. Contact holes 508 allow a metal grid 506 to electrically contact an underlying base diffusion region 503. Similarly, contact holes 507 allow a metal grid 505 to electrically contact an underlying emitter diffusion region 502. FIG. 6(b) shows the top view of the solar cell 500A. In the example of FIG. 6(b), the contact holes 508 are smaller than the base diffusion regions 503. The contact holes 507 simply extend down from the metal grid 505 to the continuous emitter diffusion region 502.

Figure 7A:
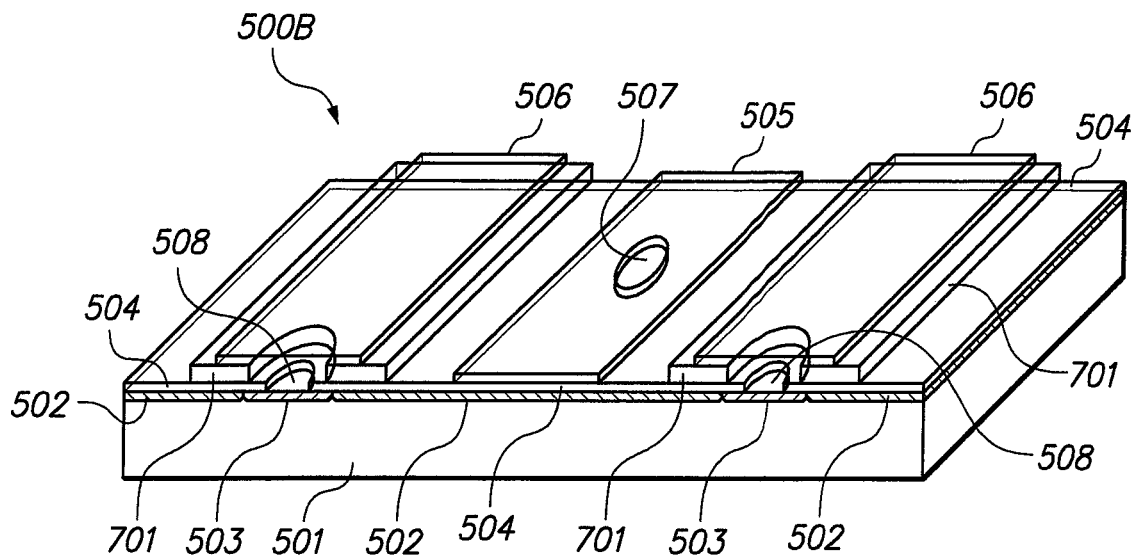
Figure 7B:
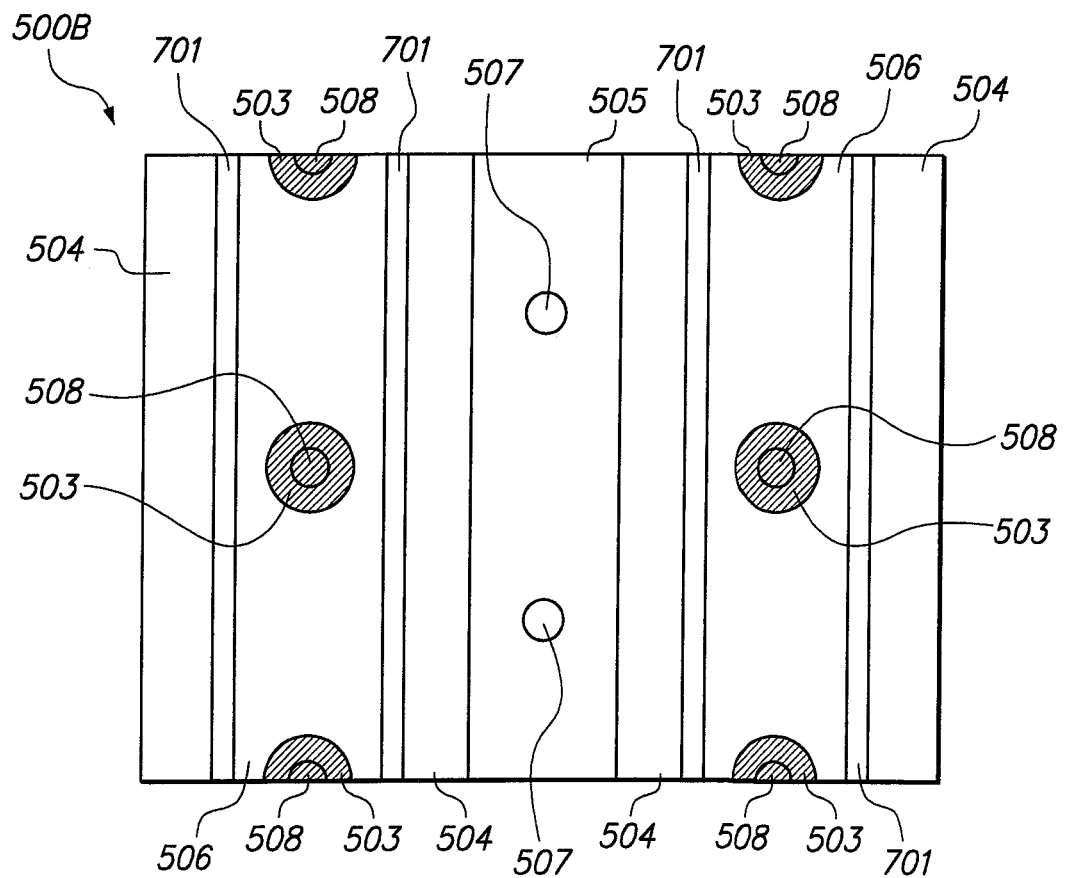

FIGS. 7(a) and 7(b) schematically show a perspective view and a top view, respectively, of a solar cell 500B in accordance with an embodiment of the present invention. Solar cell 500B is a specific embodiment of the solar cell 500A shown in FIGS. 6(a) and 6(b). Accordingly, components 501, 502, 503, 505, and 506 are thus the same as those previously described with reference to FIG. 5, and components 504, 507, and 508 are the same as those previously described with reference to FIGS. 6(a) and 6(b). Essentially, the solar cell 500B is the same as the solar cell 500A with the addition of insulator layers 701 between the insulator layer 504 and the metal grids 506.

The insulator layers 701 extend over portions of the emitter region 502 to provide an extra layer of electrical insulation between the metal grids 506 and the emitter region 502. The insulator layers 701 are beneficial in application where the insulator layer 504 may have pinholes or other imperfections that would result in the metal grids 506 being shorted to the emitter diffusion region 502. FIG. 7(b) shows a top view of the solar cell 500B. In the example of FIG. 7(b), the insulator layers 701 are limited to areas under the metal grids 506. The insulator layers 701 may also be formed under the metal grids 505 depending on the application.

The design rules (i.e. the minimum alignment tolerance and feature size allowed by a given patterning technology) dictate the size of the base diffusion region in both the strip and dotted base diffusion designs. For example, a patterning technology that allows printing of 200 microns contact openings and a 200 micron layer-to-layer tolerance will dictate that the size of the base diffusion region be around 600 microns—600 micron wide strip for the standard design or 600 micron diameter for the dotted design. The dotted design reduces the base diffusion region coverage fraction whilst keeping the distance between base diffusion regions equal, thus decreasing minority charge carrier recombination losses without increasing series resistance losses associated with the lateral flow of the majority charge carriers. Alternatively, the pitch of the dotted diffusion regions can be reduced while keeping the base coverage fraction identical, thus reducing the series resistance losses without increasing the minority charge carrier recombination associated with the lateral flow of the minority charge carriers above the base diffusion regions. An optimum configuration between those two bounds will depend on the particular solar cell. In any event, the dotted diffusion design should result in higher efficiency than either the strip diffusion design used in one-sun applications or the point diffusion design used in concentrator applications.

The performance of the dotted base diffusion design may be further enhanced by utilizing self-aligned contacts. The self-aligned contact involves patterning the base diffusion regions using the contact holes in an insulator layer used to electrically isolate the base diffusion metal grids (e.g., metal grid 506) from the continuous emitter diffusion region. A self-aligned contact process may reduce the size of a base diffusion region to the size of the contact hole. For example, using the same design rules discussed above, the diameter of the base diffusion regions may be reduced from 600 microns to 200 microns. Given that the size of the base diffusion regions approach the thickness of the wafer, the lateral transport of minority charge carriers is minimized and minority charge carriers are transported mostly vertically.

Figure 8A:
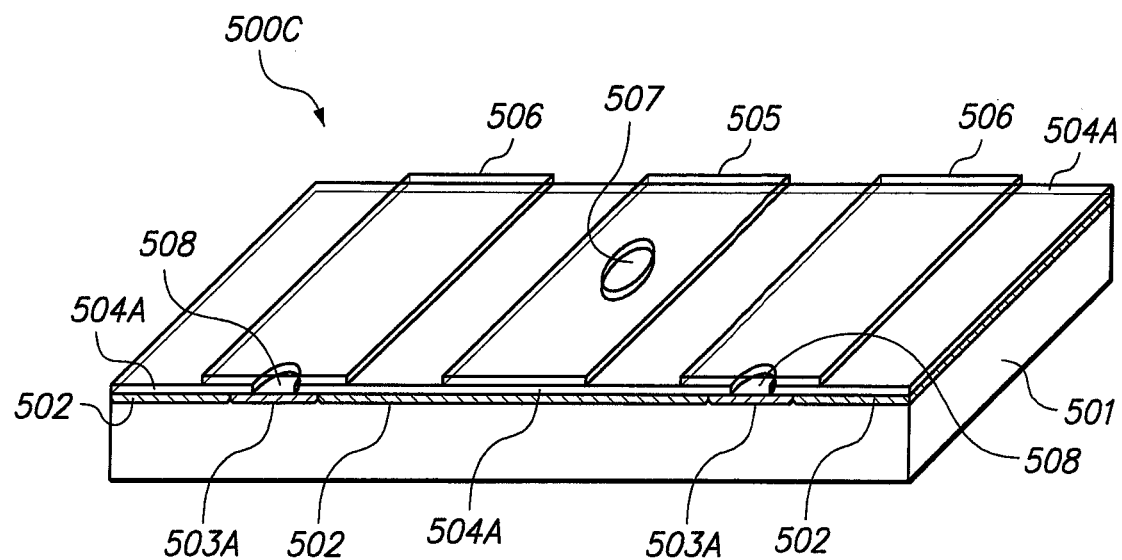
Figure 8B:
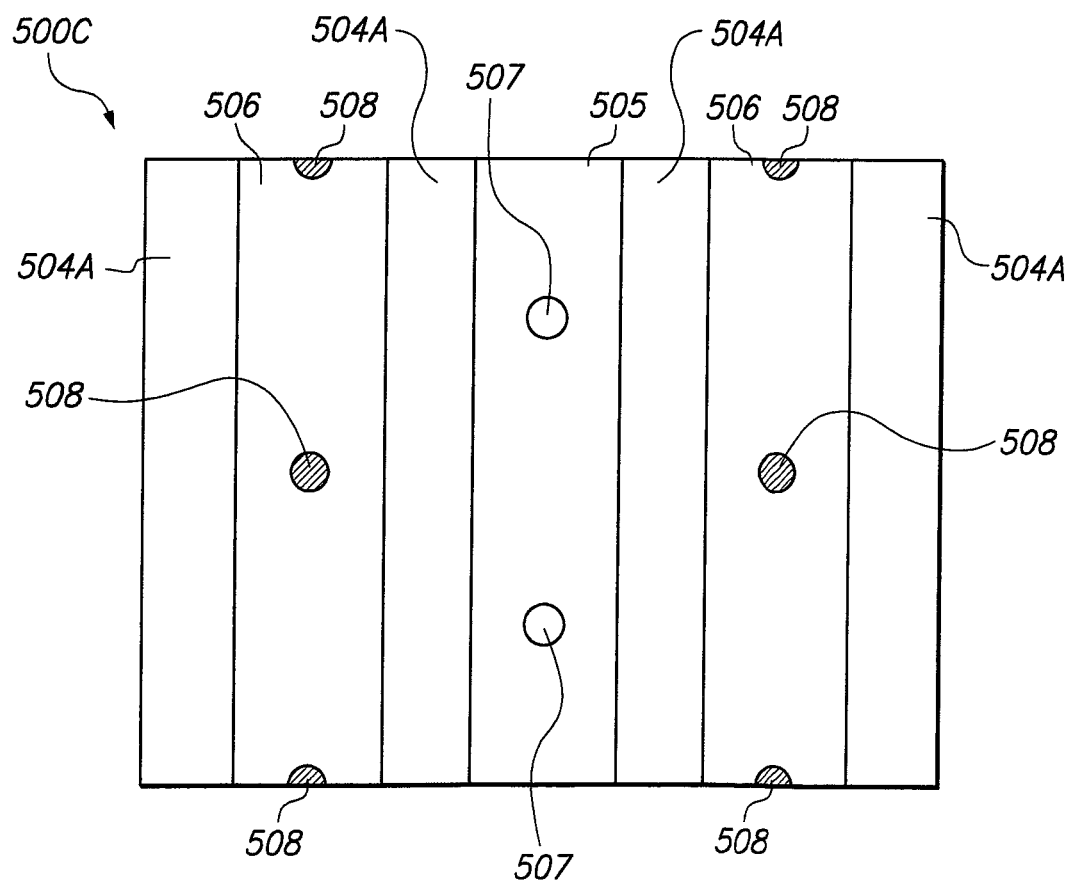

FIGS. 8(a) and 8(b) schematically show a perspective view and a top view, respectively, of a solar cell 500C in accordance with an embodiment of the present invention. Solar cell 500C is a specific embodiment of the solar cell 500A shown in FIGS. 6(a) and 6(b). The solar cell 500C is the same as the solar cell 500A except that each of its base diffusion region, now labeled as "503A", is patterned using a contact hole 508. That is, in the solar cell 500C, the contact holes 508 in the insulator layer, now labeled as "504A", are used to pattern the base diffusion regions 503A. This results in the base diffusion regions 503A having the same diameter as the contact holes 508 (see also FIG. 8(b)). All other components of the solar cells 500A and 500C are otherwise the same.

FIGS. 9(a)-9(e) show cross-sectional views of a solar cell 500B (see FIGS. 7(a) and 7(b)) being fabricated in accordance with an embodiment of the present invention. The following steps may be performed using conventional semiconductor fabrication techniques.

Figure 9A:
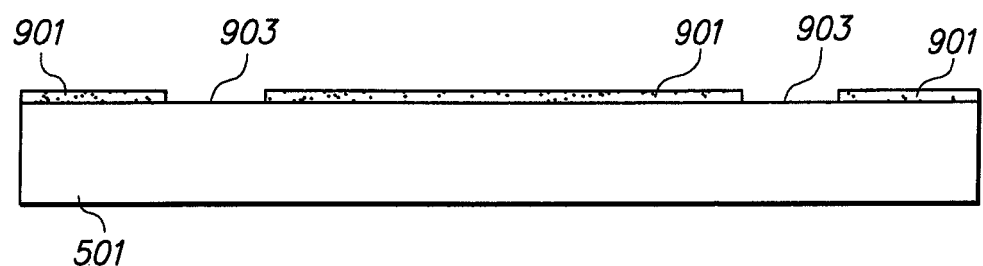
FIGS. 9(a)-9(e) show cross-sectional views of a solar cell being fabricated in accordance with an embodiment of the present invention.

In FIG. 9(a), a doped silicon dioxide layer 901 is formed on the surface of the substrate. The layer 901 is doped with the polarity of the emitter. In this example, where the substrate is an N-type silicon wafer 501, the silicon dioxide layer 901 is doped with a P-type dopant, such as boron (e.g. BSG). As will be more apparent below, dopants of the layer 901 will be subsequently driven to the wafer 501 to form a continuous emitter diffusion region therein. Openings 903 in the oxide layer 901 leave room for another doped oxide layer (layer 902 in FIG. 9(b)) to be used in forming interspersed dotted diffusion regions surrounded by the continuous emitter diffusion region. Accordingly, the openings 903 in the example of FIG. 9(a) have a dotted pattern.

Figure 9B:
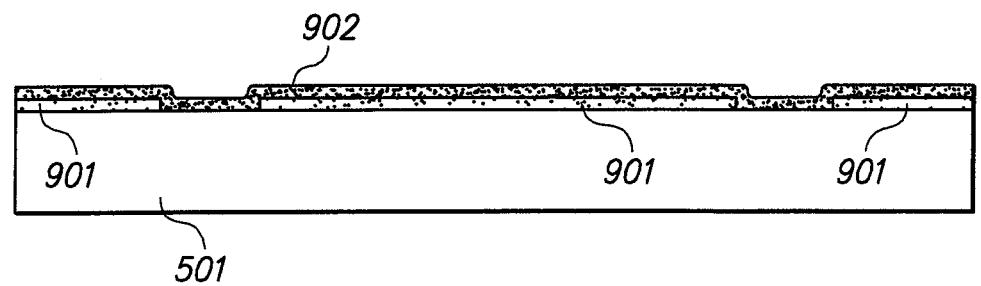

In FIG. 9(b), a doped silicon dioxide layer 902 is formed on the layer 901 and on exposed portions (i.e., openings 903) of the wafer 501. The layer 902 is doped with the polarity of the base diffusion regions. In this example, where the substrate is the N-type silicon wafer 501, the layer 902 is doped with an N-type dopant, such as phosphorus (e.g., PSG).

Figure 9C:
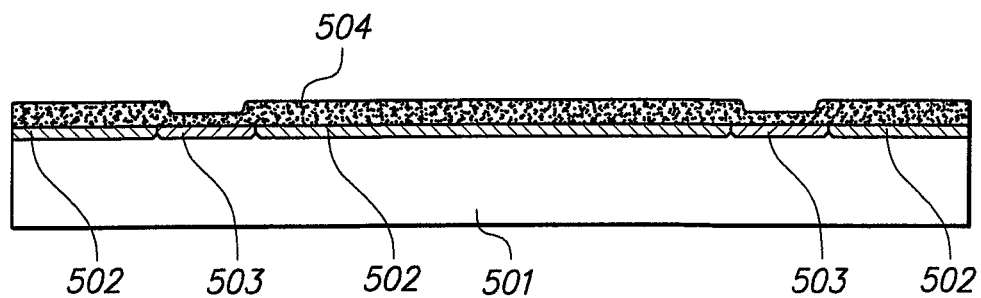

In FIG. 9(c), the dopants of oxide layers 901 and 902 are driven to the wafer 501 using a high-temperature diffusion process. This results in the formation of a continuous emitter diffusion region 502 and a plurality of base diffusion regions 503 in the wafer 501 (see also FIGS. 7(a) and 7(b)). The emitter diffusion region 502 is formed by the diffusion of the P-type dopant from the layer 901 to the wafer 501. The base diffusion regions 503 are formed by the diffusion of the N-type dopant from portions of the layer 902 in the openings 903 (see FIG. 9 (a)). The layer 901 serves as a diffusion mask to prevent the N-type dopant from the layer 902 (see FIG. 9(b)) from diffusing into where the emitter diffusion region 502 is formed. The doped layers 901 and 902 collectively serve as the insulator layer 504 after the diffusion process.

Figure 9D:
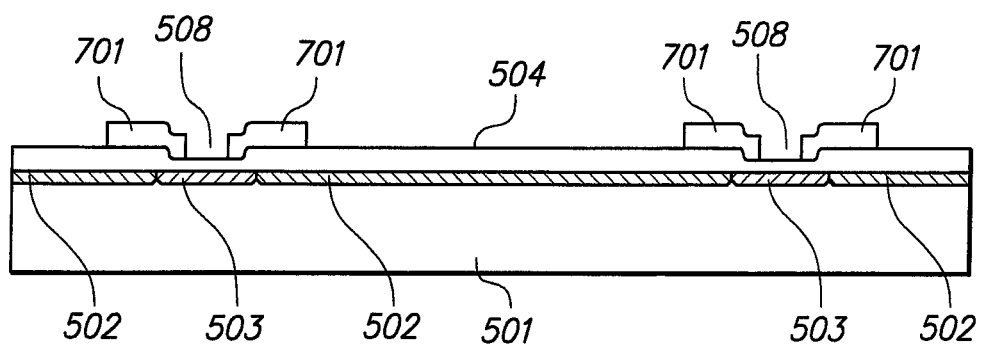

In FIG. 9(d), insulator layers 701 are formed over portions of the insulator layer 504 that lie over the base diffusion regions 503 and portions of the emitter diffusion region 502. Insulator layers 701 are preferably formed by screen-printing, ink-jet printing or other low-cost printing technique. Accordingly, insulator layers 701 may comprise polyimide or other dielectric that may be formed by screen-printing or ink-jet printing. Contact holes 508 are defined in the insulator layers 701 to allow subsequently formed metal grids 506 to electrically contact the base diffusion regions 503.

Figure 9E:
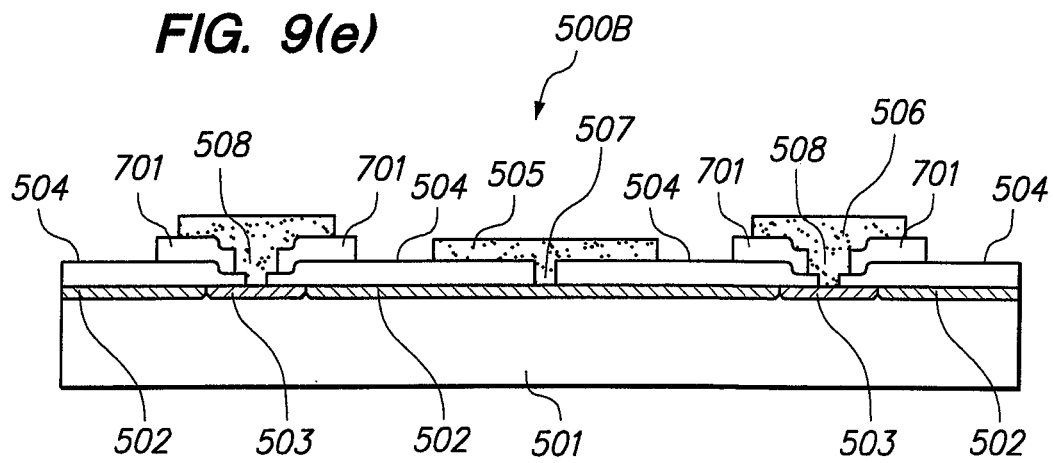

In FIG. 9(e), portions of the insulator layer 504 under the contact holes 508 are etched away. Likewise, portions of the insulator layer 504 are etched away to form contact holes 507. Metal grids 506 are formed over the insulator layers 701 and through the contact holes 508 to create electrical connections between the metal grids 506 and the base diffusion regions 503. Metal grids 505 are formed over the insulator layer 504 and through the contact holes 507 to create electrical connections between the metal grids 507 and the emitter diffusion region 502.

The solar cell 500B, and the other solar cells disclosed herein, may also be fabricated using the fabrication steps disclosed in commonly-assigned U.S. Pat. No. 6,998,288, which is incorporated herein by reference in its entirety. Other fabrication techniques for fabricating the solar cell structures disclosed herein may also be used without detracting from the merits of the present invention.

While specific embodiments of the present invention have been provided, it is to be understood that these embodiments are for illustration purposes and not limiting. Many additional embodiments will be apparent to persons of ordinary skill in the art reading this disclosure.

What is claimed is:
1. A solar cell comprising:
   a first metal contact electrically coupled to an emitter diffusion region;
   a second metal contact electrically coupled to a base diffusion region, wherein the second metal contact is formed over the base diffusion region and the emitter diffusion region, and the base diffusion region contacts the emitter diffusion region at a contact edge; and
   a first insulator between the second metal contact and the emitter diffusion region, the first insulator electrically insulating the emitter diffusion region from the second metal contact, and the first insulator forming an insulating region that extends continuously over and that contacts: a portion of the emitter diffusion region, a portion of the base diffusion region, and the contact edge.
2. The solar cell of claim 1, wherein the emitter diffusion region is a continuous emitter diffusion region.

3. The solar cell of claim 1, wherein the base diffusion region is a dotted base diffusion region.

4. The solar cell of claim 1, further comprising:
a second insulator between the first insulator and the second metal contact.

5. The solar cell of claim 1, wherein the emitter diffusion region is doped with boron and the base diffusion region is doped with phosphorus.

6. The solar cell of claim 1, wherein the first metal contact and second metal contact are interdigitated.

7. The solar cell of claim 1, wherein the substrate is an N-type silicon substrate.

8. A solar cell, comprising:
an emitter diffusion region configured to collect minority charge carriers in the solar cell;
a base diffusion region configured to collect majority charge carriers in the solar cell, wherein the base diffusion region contacts the emitter diffusion region at a contact edge;
a first metal contact electrically coupled to the emitter diffusion region;
a second metal contact electrically coupled to the base diffusion region, wherein the second metal contact is formed over the base diffusion region and the emitter diffusion region; and
a first insulator between the second metal contact and the emitter diffusion region, the first insulator electrically insulating the emitter diffusion region from the second metal contact, and the first insulator forming an insulating region that extends continuously over and that contacts: a portion of the emitter diffusion region, a portion of the base diffusion region, and the contact edge.

9. The solar cell of claim 8, wherein the emitter diffusion region is a continuous emitter diffusion region.

10. The solar cell of claim 8, wherein the base diffusion region is a dotted base diffusion region.

11. The solar cell of claim 8, further comprising:
a second insulator between the first insulator and the second metal contact.

12. The solar cell of claim 8, wherein the first metal contact and second metal contact are interdigitated.

13. The solar cell of claim 8, wherein the silicon substrate is an N-type silicon substrate.

\* \* \* \* \*